(12) United States Patent
Ohsawa

(10) Patent No.: US 6,513,138 B1
(45) Date of Patent: Jan. 28, 2003

(54) PATTERN GENERATOR FOR SEMICONDUCTOR TEST SYSTEM

(75) Inventor: Toshimi Ohsawa, Gyoda (JP)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/415,927

(22) Filed: Oct. 12, 1999

(51) Int. Cl.[7] .......................... G01R 31/28; G06F 11/00
(52) U.S. Cl. ..................... 714/738; 714/720; 714/742; 714/744
(58) Field of Search .................... 714/32, 718, 720, 714/722, 738, 739, 742, 744, 728

(56) References Cited

U.S. PATENT DOCUMENTS 5,682,390 A * 10/1997 Housako et al. ............ 714/720
6,021,515 A *  2/2000 Shimura ..................... 714/738

* cited by examiner

Primary Examiner—Emmanuel L. Moise
(74) Attorney, Agent, or Firm—Muramatsu & Associates

(57) ABSTRACT

A pattern generator for generating a test pattern that has a repetition rate higher than the basic repetition rate thereof to test a synchronous memory. The test pattern to be provided to a memory under test can be accurately modified by inverting the pattern data as a function of address data. The pattern generator includes an address generator for generating an address signal with a test rate T to be supplied to a memory under test, a data generator for generating write data to be stored in the memory under test wherein the data generator is formed of a first data generator for generating even number write data, a second data generator for generating odd number write data, an address converter provided with the address signal for generating an even number address incrementing by two at each test rate T and an odd number address incrementing by two at each test rate T, first means for inverting the even number data from the first data generator as a function of the even number address, and second means for inverting the odd number data from the second data generator as a function of the odd number address.

15 Claims, 14 Drawing Sheets

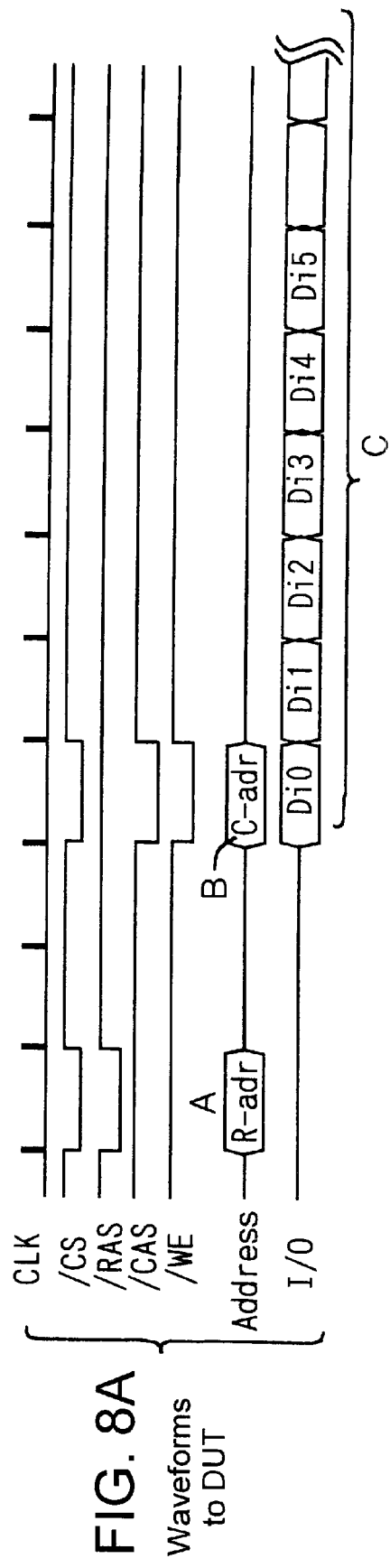
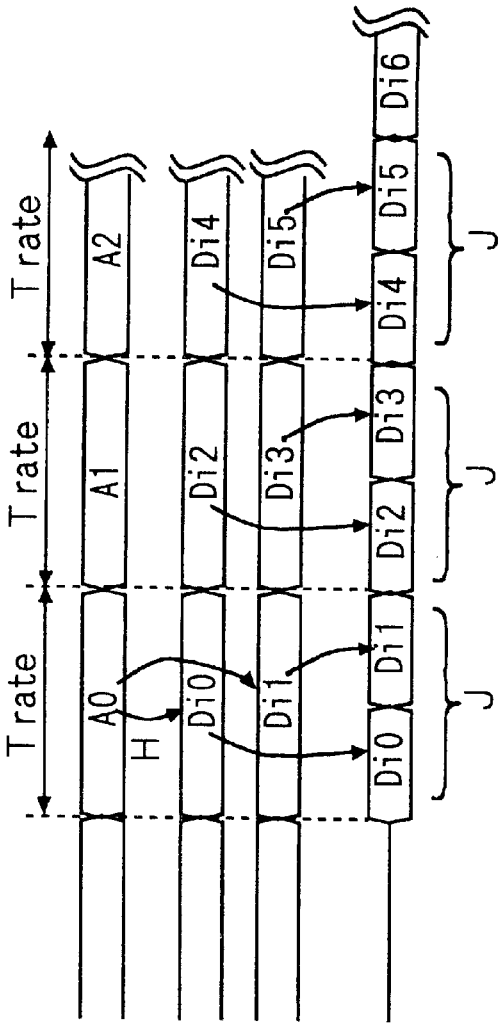
FIG. 8A Waveforms to DUT
FIG. 8B Address
FIG. 8C 1st Data
FIG. 8D 2nd Data
FIG. 8E Data Out

FIG. 12

| Sequencer Address | Sequencer Ins | Address Ins | | Data Ins | |
|---|---|---|---|---|---|
| 0 | INC | MA<3 | SA<0 | DT1<5555 | DT2<5555 |
| 1 | Label: INC | MA<MA | SA<SA+1 | DT1<DT1 | DT2<DT2 | FP1 |
| 2 | INC | MA<MA | SA<SA+1 | DT1<DT1 | DT2<DT2 | FP1 |
| 3 | INC | MA<MA | SA<SA+1 | DT1<DT1 | DT2<DT2 | FP1 |
| 4 | LOOP Label | MA<MA+8 | SA<SA+1 | DT1<DT1 | DT2<DT2 | FP1 |
| 5 | INC | | | | |

FIG. 13A

1st Address Counter

| (1) | (2) | (3) | (4) |
|---|---|---|---|
| 00000011 | 00000000 | 00000000 | |
| 00000011 | 00000001 | 00000010 | |
| 00000011 | 00000010 | 00000100 | |
| 00000011 | 00000011 | 00000110 | |
| 00001011 | 00000100 | 00001000 | |
| 00001011 | 00000101 | 00001010 | |
| 00001011 | 00000110 | 00001100 | |
| 00001011 | 00000111 | 00001110 | |
| 00010011 | 00001000 | 00010000 | |
| 00010011 | 00001001 | 00010010 | |
| .. | .. | .. | |

| (5) | (6) | (7) | |
|---|---|---|---|
| | | (7)-1 | (7)-2 |
| 00000011 | 00000101 | 00000011 | 00000101 |
| 00000001 | 00000111 | 00000001 | 00000111 |
| 00000111 | 00001001 | 00000111 | 00000001 |
| 00000101 | 00001011 | 00000101 | 00000011 |
| 00000011 | 00001101 | 00001011 | 00001101 |
| 00000001 | 00001111 | 00001001 | 00001111 |
| 00000111 | 00010001 | 00001111 | 00001001 |
| 00000101 | 00010011 | 00001101 | 00001011 |
| 00000011 | 00010101 | 00010011 | 00010101 |
| 00000001 | 00010111 | 00010001 | 00010111 |
| .. | .. | .. | .. |

FIG. 13B

2nd Address Counter

| (1) | (2) | (3) | (4) |
|---|---|---|---|
| 00000011 | 00000000 | 00000000 | 00000001 |
| 00000011 | 00000001 | 00000010 | 00000011 |
| 00000011 | 00000010 | 00000100 | 00000101 |
| 00000011 | 00000011 | 00000110 | 00000111 |
| 00001011 | 00000100 | 00001000 | 00001001 |
| 00001011 | 00000101 | 00001010 | 00001011 |
| 00001011 | 00000110 | 00001100 | 00001101 |
| 00001011 | 00000111 | 00001110 | 00001111 |
| 00010011 | 00001000 | 00010000 | 00010001 |
| 00010011 | 00001001 | 00010010 | 00010011 |
| .. | .. | .. | .. |

| (5) | (6) | (7) | |
|---|---|---|---|
| | | (7)-1 | (7)-2 |
| 00000010 | 00000100 | 00000010 | 00000100 |
| 00000000 | 00000110 | 00000000 | 00000110 |
| 00000110 | 00001000 | 00000110 | 00000000 |
| 00000100 | 00001010 | 00000100 | 00000010 |
| 00000010 | 00001100 | 00001010 | 00001100 |
| 00000000 | 00001110 | 00001000 | 00001110 |
| 00000110 | 00010000 | 00001110 | 00001000 |
| 00000100 | 00010010 | 00001100 | 00001010 |
| 00000010 | 00010100 | 00010010 | 00010100 |
| 00000000 | 00010110 | 00010000 | 00010110 |
| .. | .. | .. | .. |

PATTERN GENERATOR FOR SEMICONDUCTOR TEST SYSTEM

FIELD OF THE INVENTION

This invention relates to a pattern generator to be used in a semiconductor test system for testing semiconductor devices, and more particularly, to a pattern generator which can provide high speed test pattern to a semiconductor device under test by multiplexing two or more parallel test patterns while modifying the test pattern as a function of address signals provided to the device under test.

BACKGROUND OF THE INVENTION

The basic configuration of a semiconductor test system essential to the present invention is briefly explained with reference to the block diagram of FIG. 3 in which a device to be tested is a semiconductor memory. The detailed explanation is omitted since a basic structure of a semiconductor test system is well known in the art. In FIG. 3, the basic elements in the test system includes a pattern generator (PG) 150, a wave formatter or frame controller (FC), a logic comparator (DC), and a failure memory (FM). A device under test (DUT) receives a test pattern from the wave formatter FC and outputs the resultant response signal to the logic comparator DC.

The pattern generator 150 generates an address signal, a write data signal, a control signal, and an expected value signal. The address signal is provided to the DUT through the wave formatter FC as well as to the failure memory FM. Normally, the address information provided to the DUT and failure memory FM are identical to one another. In a write mode of the memory device under test (DUT), the write data signal is also provided to the DUT after being wave shaped by the wave formatter FC.

At the logic comparator DC, the output signal of the DUT, i.e., the stored data in the memory under test is read out and is compared with the expected value signal provided from the pattern generator 150. When there arises mismatch between the stored data and the expected value signal, fail signals FD1-FDn are produced by the comparator DC which are provided to the failure memory FM.

The failure memory FM has memory addresses corresponding to the addresses of the DUT and thus stores the fail signals FD1-FDn in the address locations identical or indicative of the address locations of the DUT causing the fail signals. Thus, as a result of the device testing, by referring to the stored data in the failure memory FM, fail analysis can be performed as to which data bit locations and which address locations of the DUT the fails have occurred.

FIG. 4 shows a basic configuration of the pattern generator related to the subject matter of the present invention. The pattern generator of FIG. 4 includes a sequence generator 100, an address signal generator 200, a data signal generator 300, and a control signal generator 400. The outputs of the address generator 200, data generator 300 and control signal generator 400 are provided to the wave formatter FC of FIG. 3.

The sequence generator 100 continuously generates sequence data 100s for producing an arbitrary test pattern corresponding to a device under test, and provides the sequence data to the address signal generator 200, the data signal generator 300, and the control signal generator 400. The sequence data 100s is primarily an address signal with a test rate T to access a memory (210, 310, 410) provided in each of the above noted three generators.

The address signal generator 200 generates a pattern signal relating to X and Y addresses of the memory under test (DUT). The pattern signal including the X and Y addresses are provided to the wave formatter FC, failure memory FM, and data signal generator 300. At the wave formatter PC, the pattern signal is wave shaped based on the timing condition of the address pins of the DUT. At the failure memory FM, the pattern signal is used as address data of the failure memory for storing the fail signals produced as a result of the logic comparison by the logic comparator DC.

The data signal generator 300 generates a pattern signal including write data to be stored in the DUT (memory device under test) and expected value data. The pattern signal from the data signal generator 300 is provided to the wave formatter FC and the logic comparator DC. The control signal generator 400 generates a pattern signal including a R/W (read/write) control signal (/WE (write enable), /OE (output enable), /CE (chip enable)) and a driver enable signal (DRE) for controlling the operation of pin electronics (I/O) of the test system and the DUT. The pattern signal from the control signal generator 400 is provided to the pin electronics and DUT through the wave formatter FC.

The configuration and operation of the data signal generator 300 is further explained with reference to FIGS. 5, 6 and 7. As shown in FIG. 5, the data signal generator 300 includes a data operation control memory 310 and a data generator 320. The data operation control memory 310 is a memory to store operation instructions to allow various operations of the data generator 320 as will be described later. The data operation control memory 310 receives the sequence data 100s from the sequence generator 100 as an input address data and produces control data 310s by reading stored contents in the specified address. The control data 310s is provided to the data generator 320.

The major components of the data generator 320 includes a first data generator 321a, a second data generator 321b, an address function generator 322, a data topology controller 323, a first inverter 325a, a second inverter 325b, a first topology inverter 326a, and a second topology inverter 326b. The data topology controller 323 and the topology inverter 326 may not be provided in other types of semiconductor test system.

The first data generator 321a and second data generator 321b are configured identical to each other. When the test pattern is applied to the DUT in a repetition rate two times higher (double rate mode) than the normal test cycle T, the outputs of the first and second data generators 321a and 321b are multiplexed by the wave formatter FC. Thus, in such a situation, the first data generator 321a is used as an even number pattern generator, and the second data generation 321b is used as an odd number pattern generator. Further, in the double rate mode, the first and second data generators 321a and 321a receive control data 310s which are different from one another from the memory 310.

An output signal 321as of the first data generator 321a which is formed of n bits is transferred to the output of the data generator 320 as a first data signal 326as through the first inverter 325a and the first topology inverter 326a. Similarly, an output signal 321bs of the second data generator 321a which is formed of n bits is transferred to the output of the data generator 320 as a second data signal 326bs through the second inverter 325b and the second topology inverter 326b. The first and second data signals 326a and 326b are in a parallel form signal 300s having 2n bits. The output signal 300s is combined, for example, parallel-to-serial converted by the formatter FC, to create a n-bit signal having two times higher rate.

The address function generator 322 generates a signal 322s indicating inversion information for inverting the data in the first and second inverters 325a and 325b. The inversion information is created as a function of the input address data. The purpose of the data inversion is to easily generate a specific test pattern to test the relationship between the specified memory cells and the peripheral memory cells physically arranged on the X and Y addresses. The inversion information is thus generated by the address function generator 322 when received an address signal A200sfrom the address signal generator 200 and the control data 310s from the data operation control memory 310.

Based on the inversion information signal 322s from the address function generator 322, special test patterns such as a checkerboard pattern, a diagonal patter, and etc. are generated relative to the X and Y addresses of the memory device under test. Namely, such special test patterns are produced by inverting the output data of the first and second data generators 321a and 321b by the first and second inverters 325a and 325b in response to the inversion information signal 322s.

FIG. 6 shows a concept of generating such specific test patterns through the data inversion process. The example of FIG. 6 shows the case where a checkerboard pattern is generated for a memory under test having 16 memory cells with an X address of 4 and a Y address of 4. An example of checkerboard pattern is shown in the upper part of FIG. 6. The data generator 321 generates the data pattern shown in the upper left of FIG. 6. The address function generator 322 generates the inversion information as shown in the lower left of FIG. 6. The inversion information is indicated by one bit signal which shows "1" for each even address and "0" for each odd address.

Based on the inversion information, the inverter 325 (first and second inverter 325a and 325b) changes the data pattern from the data generator 321 (first and second data generator 321a and 321b) when the inversion information shows "1". As a result, as shown in the right of FIG. 6, the checkerboard pattern can be easily generated which is applied to the memory device under test.

Similarly, the inversion information technique such as the above is further used in generating a specific test pattern in consideration of topologies of the memory device under test. According to certain types of memory device under test, based on a unique physical configuration of memory cells therein, charge and discharge operations for specific memory cells may be reversed from the ordinary operations. For example, for certain memory cells, electric potential is discharged when writing data "1" therein while the other memory cells is charged when writing data "1" therein. Such a reversed situation arises randomly in the address or uniformly for all cells in a specific column or row address of the memory device under test. To effectively test the memory device having such a special physical structure, it is known in the art that a test pattern having write data in which a certain row or column address or a certain word is inverted from the other can effectively test such memory devices.

For generating the test pattern to meet the topologies of the DUT such as above, the data topology controller 323 generates inversion information to be used in the first and second topology inverters 326a and 326b. Thus, at the output of the data generator 320, the test pattern is modified by the logical operation in the data generator to produce the effective test pattern without requiring to know the specific physical condition in the memory under test.

The inversion information for the topology inverters 326 is generated by the data topology controller 323 in a manner similar to the address function generator 322 as a function of the address data. More specifically, the data topology controller 323 receives the address signal A200s from the address signal generator 200 and the control data 310s from the data operation control memory 310, and generates a signal 323s showing the inversion information. The inversion information is to invert the pattern data to be written in the memory locations specified by the X and Y addresses of the memory under test.

FIG. 7 shows a concept of generating such specific test patterns through the data inversion process with respect to the DUT topology. The example of FIG. 7 shows the case where the data in specific column addresses is inverted because, for example, the memory cells in such columns are charged "0" even when wiring data "1" therein. The example of FIG. 7 shows the case in which a test pattern is generated for a memory under test having 16 memory cells with an X address of 4 and a Y address of 4. An example of inverted test pattern is shown in the upper part of FIG. 7 for testing a memory device having a specific topology.

To produce the inverted test pattern, first, the data generator 321 generates the data pattern shown in the upper left of FIG. 7. Then the data topology controller 323 generates the inversion information as shown in the lower left of FIG. 7. The inversion information is indicated by an output signal which shows "1" for each odd X address and "0" for each even X address. Since the reversed operation as to the charge and discharge also arises in a direction of a word width, the output signal of the data topology controller 323 is formed of n bits which is provided to the topology inverter 326, i.e., the first and second topology inverters 326a and 326b of FIG. 5. Based on the inversion information, the inverter 326 changes the data pattern from the data generator when the inversion information shows "1". As a result, as shown in the right side of FIG. 7, the test pattern whose odd column data is inverted can be easily generated to be applied to the memory device under test.

Referring back to FIG. 5, more detailed operations in the first and second inverter 325a and 325b as well as the first and second topology inverters 326a and 326b are explained in the following. Upon receiving the even number pattern signal 321as having n-bit width from the first data generator 321a, the n-bit width data is output in which specified data is inverted by first inverter 325a based on the address inversion signal 322s from the address function generator 322. The output of the first inverter 325a is provided to the first topology inverter 326a.

The second inverter 325b works in a manner similar to the first inverter 325a. Upon receiving the odd number pattern signal 321bs having the n-bit width from the second data generator 321b, the data having the n-bit width is output in which specified data is inverted by second inverter 325b based on the address inversion signal 322s from the address function generator 322. The output of the second inverter 325b is provided to the second topology inverter 326b.

Upon receiving the data having n-bit width from the first inverter.325a, the first topology inverter 326a outputs the first data signal 326as having n-bit width in which specified data is inverted by the topology inversion signal 323s in response to the n-bit signal from data topology controller 323. Similarly, upon receiving the data having n-bit width from the second inverter 325b, the second topology inverter 326*b* outputs the second data signal 326*bs* having n-bit width in which specified data is inverted by the topology inversion signal 323*s* in response to the n-bit signal from the data topology controller 323. Although not shown, the first and second data signals 326*as* and 326*bs* (output signal 300*s*) are eventually combined (multiplexed) by, for example, the wave formatter FC.

As briefly noted above, the data generator 320 of FIG. 5 is configured to enable the double rate mode in which the test pattern is produced in a rate two times higher than the normal mode for testing a high speed memory device. Such a pattern generation in multiplexing the two test patterns is shown in the timing chart of FIG. 8. This is an example wherein the write data is provided to the DUT (memory under test) in a rate (T/2) which is twice as fast as the basic test rate T of the semiconductor test system. To do this, two separate test patterns generated in the test rate T are multiplexed, i.e., parallel-to-serial converted, and a resultant series test pattern is supplied to the DUT.

Such a double rate mode is provided in a semiconductor test system to test a high-speed memory device, such as a synchronous DRAM (SDRAM), with relatively low cost. Suppose an SDRAM to be tested is capable or writing data in a rate of 200 MHz in a burst mode, a semiconductor test system for fully testing the SDRAM has to provide a test pattern having the data rate of 200 MHz. However, since the semiconductor test system is a very large system having several hundred or more test channels, for example, it extremely increases the cost of the system if the basic test rate is designed to be 200 MHz. Thus, it is cost effective to design the test system with the test rate of 100 MHz while employing the double rate mode to generate the test pattern of 200 MHz for testing such a high speed semiconductor device.

With reference to the timing charts of FIG. 8, an example of SDRAM operates in a manner shown in FIG. 8A. The address signal A200*s* generated by the address signal generator 200 shows the continuous address values A0, A1, A2 in the test rate T as shown in FIG. 8B. The SDRAM to be tested has a burst address mode in which address signals are generated by itself for a certain length of bits when a start address (shown by "X" in FIG. 8A) is given thereto. During the burst address mode, a semiconductor test system must provide high-speed write data as shown by "Y" in FIG. 8A after the start address is given to the SDRAM.

Two separate patters of write data are generated by data generators in order to provide the above noted high speed continuous write data. Thus, the first data generator 321*a* generates the first data comprising even-number data Di0, Di2, Di4 as shown in FIG. 8C in the test rate T in response to the address signal of FIG. 8B. The second data generator 321*a* generates second data comprising odd-number data Di1, Di3, Di5 as shown in FIG. 8D in the rate T in response to the address signal of FIG. 8B. The parallel data from the first and second data generators are multiplexed by the wave formatter FC so that the write data having a test rate T/2 is produced as shown in FIG. 8E which is applied to the SDRAM under test.

Here, address generation in synchronous memories is described in more detail. As is known in the art, synchronous memories such as synchronous DRAMs and synchronous SRAMs have a burst address mode which includes an interleave mode and a sequential mode. The burst address mode is a mode of address access in a synchronous memory wherein data in the same row or column address is read or written continuously for a block consisting of 2, 4, or 8 words or the like. The access for such words in the block of memory cells is made by simply providing a start address of the block as noted above. Afterward, the remaining addresses for the block are generated automatically in the SDRAM by itself.

There are two methods for the address sequence of the burst mode; the sequential mode and the interleave mode as noted above. In the sequential mode, the burst address is generated in a continuous sequence while in the interleave mode, the burst address is generated by a sequence based on an exclusive OR logic. When the start address for the continuous access block is provided to the SDRAM, the burst address for the corresponding memory block is produced by the SDRAM either by the sequential mode or the interleave mode.

The pattern generator in a semiconductor test system produced by an assignee of this invention has a function to achieve the above described addressing in the address generator. The burst address generated by the pattern generator of the test system is provided to the failure memory FM. This is because even though only the start address has to be provided to the SDRAM for write and read testing, fail information must be stored in the failure memory FM in the address corresponding to the burst address in the SDRAM under test.

FIG. 10 shows an example of configuration in the address generator in the semiconductor test system for testing synchronous memories. In FIG. 10, the address generator includes a main address generator 510, a sub-address generator 520, an interleave address converter 530, a sequential address converter 540 and an address selector 550. For generating the burst address, the sub-address generator 520 acts as a simple increment counter to increment the address data by one at each clock.

The interleave address converter 530 takes exclusive logical sum (EOR) of address data from the main address generator 510 and address data from the sub-address generator 520. The sequential address converter 540 adds the address data of the main address generator 510 and the address data of the sub-address generator 520. The address selector 550 selects one of the addresses generated by the main address generator 510, interleave converter 530, and sequential converter 540.

In operation, for generating the burst address for a predetermined bit length, the address data from either the interleave converter 530 or the sequential converter 540 is selected. For generating the normal type of address data, the address data from the main address generator 510 is selected. Which burst mode should be selected is determined by the specification of the memory device under test.

Thus, in the conventional technology, by using a predetermined program for executing the address conversion function as shown in FIG. 10, it is possible to generate the interleave or sequential burst address at relatively low speed. However, it is difficult to generate the burst address or write data for such a synchronous memory at high-speed to match the internal speed of high speed DUT such as a synchronous memory.

When the pattern to be applied to the DUT is considered, only a start address must be generated, and thus, high-speed pattern generation is not essential, since only one address generation among, for example, eight addresses is required. To increase the generation speed by two times, for example, multiplexing two address patterns will be sufficient to generate the start addresses at high speed. However, in multiplexing the address pattern, there is a drawback that data generation, such as data inversion as a function of address data is impossible since the burst address can be generated only out of two. Similarly, there is a drawback that the data inversion in view of the device topology cannot be properly achieved. Such problems are further explained in the following.

Referring back to the block diagram of FIG. 5 and the timing charts of FIG. 8, upon receiving identical address signal A200s, the address function generator 322 and data topology controller 323 generate the inversion signal. In the case where the double rate mode must be used in the test system, within the synchronous memory under test, the address signal having the speed two times higher (200 MHz) than the test rate T (100 MHz) of the semiconductor test system is automatically generated. In the double rate mode of the test system, the write data is stored in the memory under test with the speed two times higher (200 MHz) than the test rate T (100 MHz) as shown in FIG. 8E based on the burst address internally generated.

In this double rate mode, however, the address signal A200s in FIG. 5 provided to the address function generator 322 and data topology controller 323 does not show address information concerning the double rate of the write data provided to the memory under test. This means that the inversion signals generated by the address function generator 322 or data topology controller 323 do not accurately represent the positions of the data to be inverted. As a consequence, it is not possible to generated the write data at the output of the inverters 325 and 326 in which the write data for intended memory cells is accurately inverted.

SUMMARY OF THE INVENTION

Therefore, it is an object of the present invention to provide a semiconductor test system having a pattern generator that can produce a multiplexed test pattern that has a repetition rate higher than the basic repetition rate of each test pattern.

It is another object of the present invention to provide a semiconductor test system which can provide high speed test pattern to a semiconductor device under test by multiplexing two or more parallel test patterns while modifying the test pattern as a function of address signals provided to the device under test.

It is a further object of the present invention to provide a pattern generator to be used in a semiconductor test system which can easily generate write data to be stored in a synchronous memory under test when the memory under test is in a burst address mode.

In order to solve the problem above, in the present invention, the pattern generator for generating a test pattern to test a memory device, is comprised of:

an address generator for generating an address signal with a test rate T to be supplied to a memory device under test:

a data generator for generating write data to be stored in the memory device under test, the data generator comprising:
  a first data generator for generating even number write data;
  a second data generator for generating odd number write data;
  an address converter provided with the address signal from the address generator for generating an even number address incrementing by two at each test rate T and an odd number address incrementing by two at each test rate T;
  first means for inverting said even number data from the first data generator as a function of the even number address from the address converter; and
  second means for inverting the odd number data from the second data generator as a function of the odd number address from the address converter.

According to the present invention, the semiconductor test system having a pattern generator is capable of producing a multiplexed test pattern that has a repetition rate higher than the basic repetition rate of each test pattern. The data in the test pattern to be provided to a semiconductor device under test can be accurately modified by inverting the specified data therein as a function of address data, thereby effectively testing the semiconductor device at high speed.

BRIEF DESCRIPTION OF THE DRAWINGS

FIGS. 8A–8E are timing charts showing a burst mode operation in a synchronous memory under test and an operation of producing write data to the synchronous memory by the pattern generator in the semiconductor test system.

FIG. 12 is a diagram showing an example of pattern program for generating test pattern in the pattern generator of the present invention.

FIG. 13 is a diagram showing an example of address conversion in the first and second address converters in the pattern generator of the present invention.

DETAILED DESCRIPTION OF THE PREFERRED EMBODIMENTS

Figure 1:
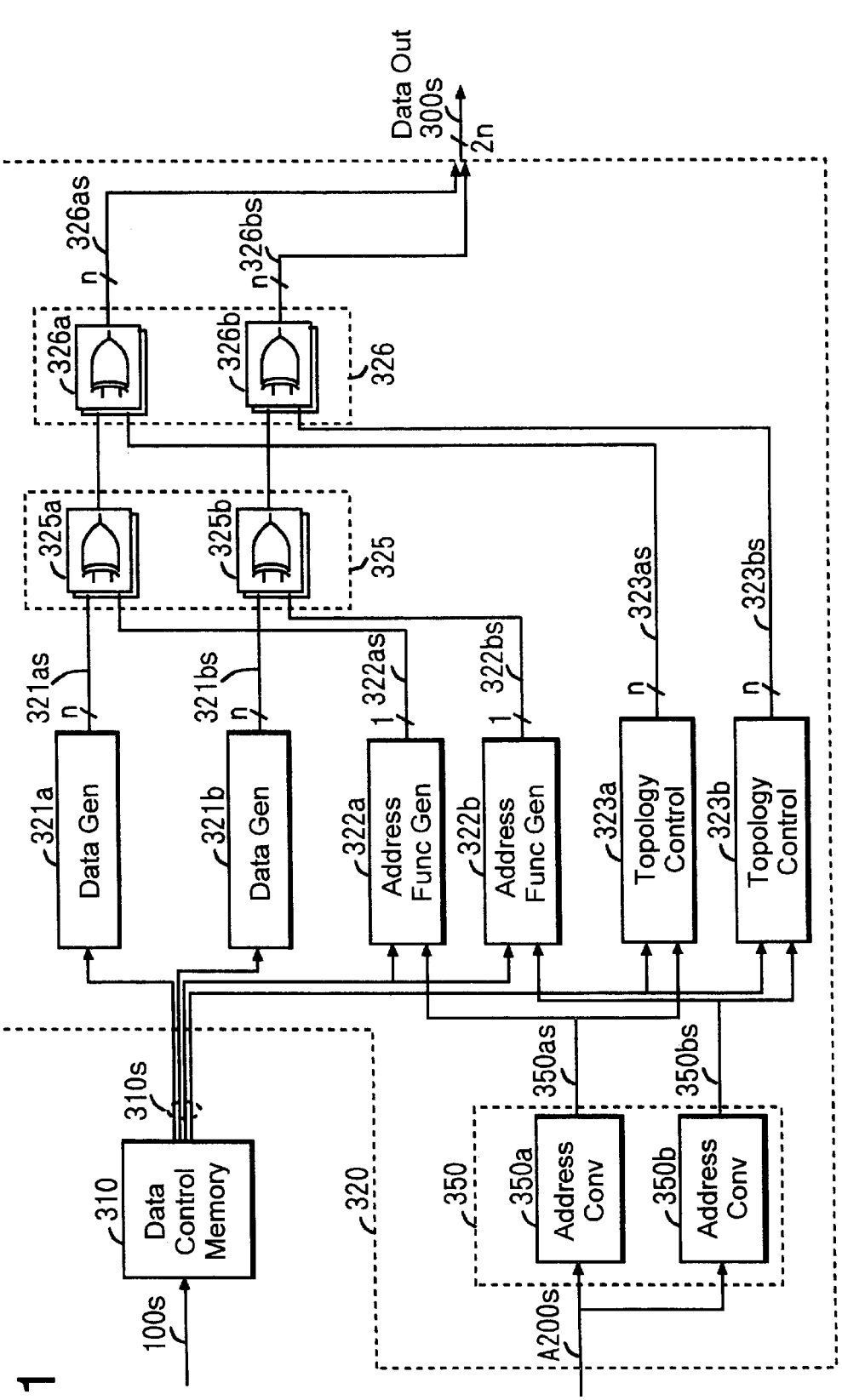
FIG. 1 is a schematic block diagram showing an example of structure in a data generator employed in the pattern generator of the present invention.
Figure 5:
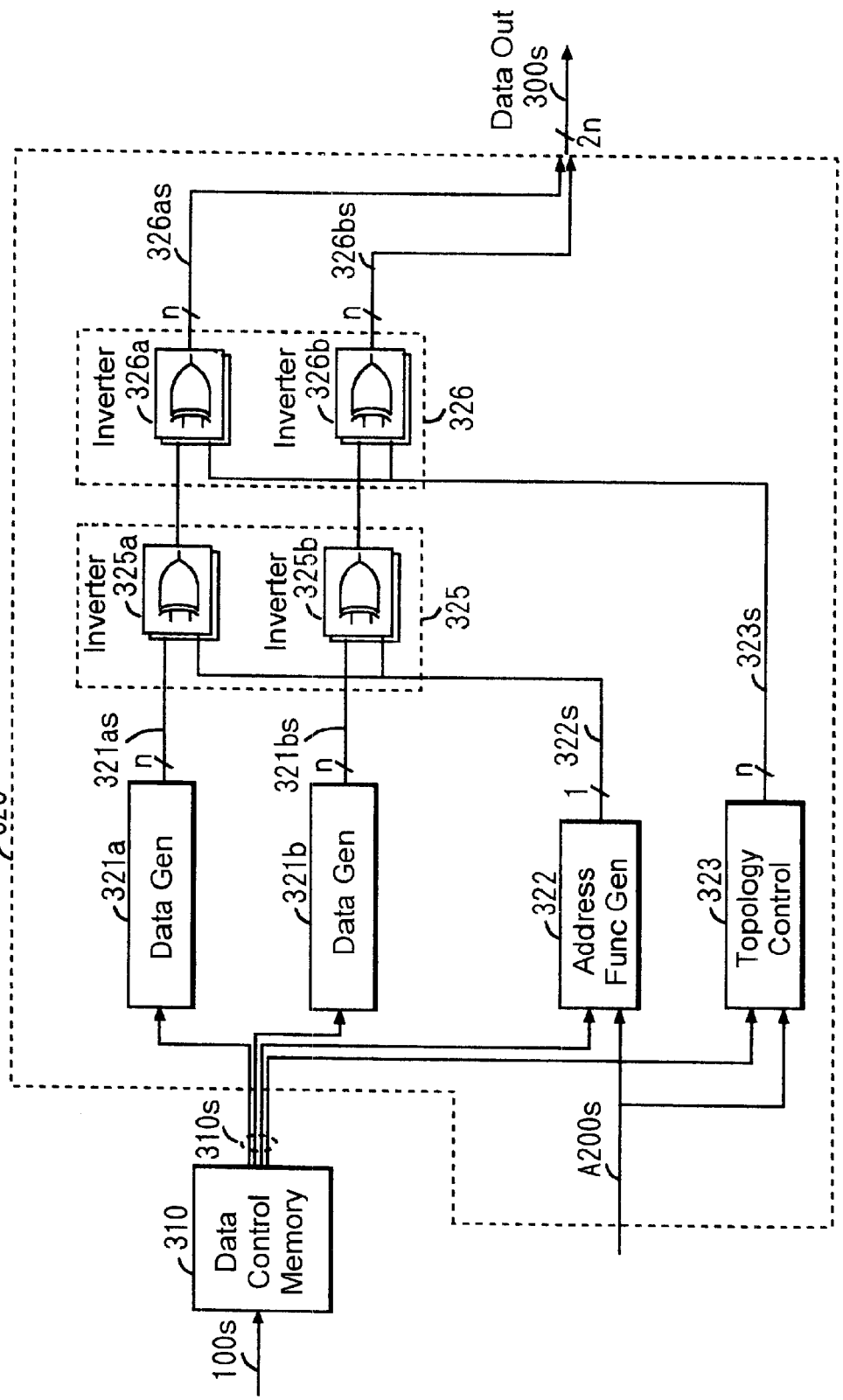
FIG. 5 is a block diagram showing an example of structure in the conventional data generator in the pattern generator of FIG. 4.

The present invention is explained with reference to the block diagram of FIG. 1 and timing charts of FIG. 2. The block diagram of FIG. 1 shows an example of structure in a data signal generator 300 to be used in the pattern generator of the present invention. The timing diagrams of FIG. 2 show an operation of the data signal generator of FIG. 1. In FIGS. 1 and 2, the components identical to that shown in the conventional example of FIGS. 5 and 8 are designated by the same reference numerals.

The data signal generator 300 of FIG. 1 is formed of a data operation control memory 310 and a data generator 320. The data operation control memory 310 is a memory to store operation instructions to allow various operations of the data generator 320. The data operation control memory 310 receives the sequence data 100s from the sequence generator 100 as an input address thereof and produces control data 310s which is provided to the data generator 320. The repetition rate of the sequence data 100s is, for example, the test rate T.

The major components of the data generator 320 includes an address converter 350 having a first address converter 350a and a second address converter 350b, a first data generator 321a, a second data generator 321b, a first address function generator 322a, a second address function generator 322b, a first data topology controller 323a, a second data topology controller 323b, a inverter 325 having a first inverter 325a and a second inverter 325b, and a topology inverter having a first topology inverter 326a and a second topology inverter 326b. As can be seen in FIG. 1, the data generator 320 of the present invention is provided with two address function generators 322a and 322b, two address converters 350a and 350b, and two data topology controllers 323a and 323b.

Upon receiving the address signal A200s in the test rate T that is output continuously by the address signal guarantor 200, the address converter 350 outputs address signals having a repetition rate two times higher than the test rate T. Namely, the first address converter 350a receives the address signal A200s and produces an even-number address signal 350as that shows a doubled value of the address signal A200s at the test rate T. The even number address signal 350as is provided to the first address function generator 322a and first data topology controller 323a. The second address converter 350b receives the address signal A200a and produces an odd number address signal 350bs that shows a doubled value of the address signal A200s plus one at the test rate T. The odd number address signal 350bs is provided to the second address function generator 322b and second data topology controller 323b.

In receiving the even number address signal 350as, the first address function generator 322a produces inversion information signal 322as as a function of the address data. The inversion information signal 322as is provided to the first inverter 325a. Similarly, in receiving the odd number address signal 350bs, the second address function generator 322b produces inversion information signal 322bs as a function of the address data. The inversion information signal 322bs is provided to the second inverter 325b.

Figure 6:
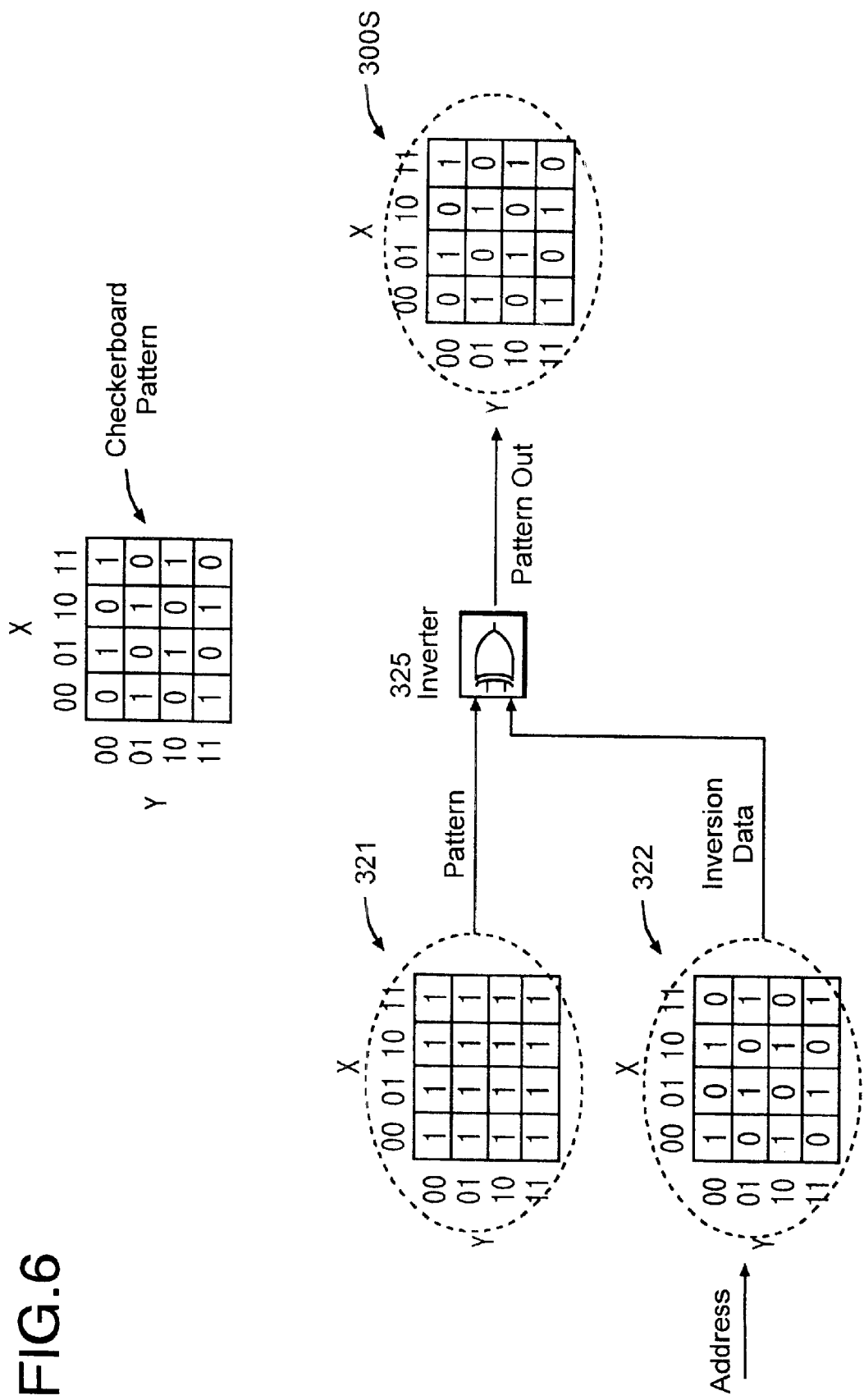
FIG. 6 is a schematic diagram showing the concept of inverting the write data in the test pattern for a memory device under test as a function of address data.

The write data (pattern signals) 321as and 321bs from the first and second data generators are respectively inverted by the first and second inverters 325a and 325b based on the inversion information signals 322as and 322bs. Consequently, by multiplexing the write data in the wave formatter FC, the resultant write data with the repetition rate which is two times higher than the test rate T is produced to be stored in the synchronous memory under test. In this arrangement, the inversion information which accurately corresponds to the output data of the first and second data generators 321a and 321b is provide to the first and second inverters 325a and 325b. Thus, even in the double rate mode, the write data is properly inverted as a function of the address data, thereby forming a test pattern such as a checkerboard pattern shown in FIG. 6.

Figure 7:
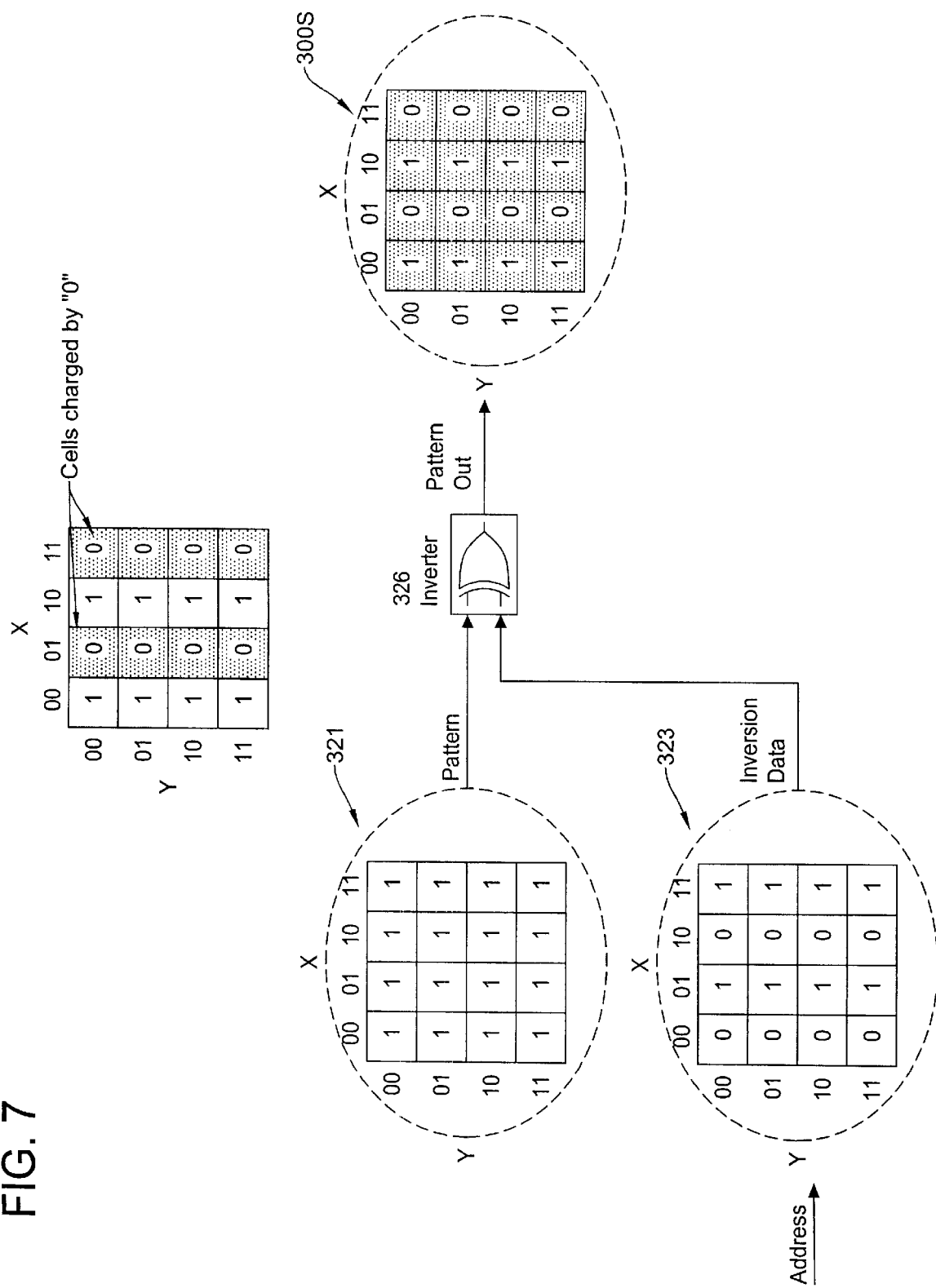
FIG. 7 is a schematic diagram showing the concept of inverting the write data in the test pattern for testing a topological condition of a memory under test as a function of the address data.

As described with reference to FIGS. 5 and 7, in a certain type of memory under test, because of the unique physical configuration (topology) of memory cells therein, charge and discharge operations for specific memory cells may be reversed from the ordinary operations. To effectively test the memory device having such a special physical structure, a test pattern having write data must be modified so that write data in a certain row or column address or in a certain word be inverted. In the present invention, such an inversion of write data concerning the topology of the memory device under test can be easily achieved even in the double rate mode.

Namely, in the arrangement of FIG. 1, in receiving the even number address signal 350as, the first data topology controller 323a produces inversion information signal 323 as a function of the address data. The inversion information signal 323as is provided to the first topology inverter 326a. Similarly, in receiving the odd number address signal 350bs, the second data topology controller 323b produces inversion information signal 323bs as a function of the address data. The inversion information signal 323bs is provided to the second topology inverter 326b.

The write data 321as from the first data generator 321a and through the first inverter. 325a is inverted based on the inversion information signal 323as by the first topology inverter 326a. The write data 321bs from the second data generator 321a and through the second inverter 325b is inverted based on the inversion information signal 323bs by the second topology inverter 326a. The resultant write data is provided to the wave formatter FC where it is multiplexed (parallel-serial converted).

Therefore, the write data with the repetition rate of two times higher than the test rate T is produced to be stored in the synchronous memory under test. In this arrangement, the inversion information which accurately corresponds to the output data of the first and second data generators 321a and 321b is provide to the first and second topology inverters 326a and 326b. Thus, even in the double rate mode, the write data is properly inverted as a function of the address data, thereby easily forming a test pattern such as shown in FIG. 7 to effectively test the topology of the memory device under test.

The operation of the pattern generator described above is further explained with reference to the timing charts of FIG. 2. Here, it is assumed that the address signal A200s from the address signal generator 200 indicates continuous address values A0, A1, A2, . . . in the test rate T as shown in FIG. 2A which is the same as in the case of FIG. 8. It is also assumed that the address sequence in the burst mode of DUT, a synchronous memory for example, has a speed two times faster than the test rate T. Thus, for testing such DUT, the semiconductor test system is set to the double rate mode where the repetition rate of the test pattern is doubled by the multiplexing technique.

Figures 2A, 2B, 2C, 2D, 2E, 2F:
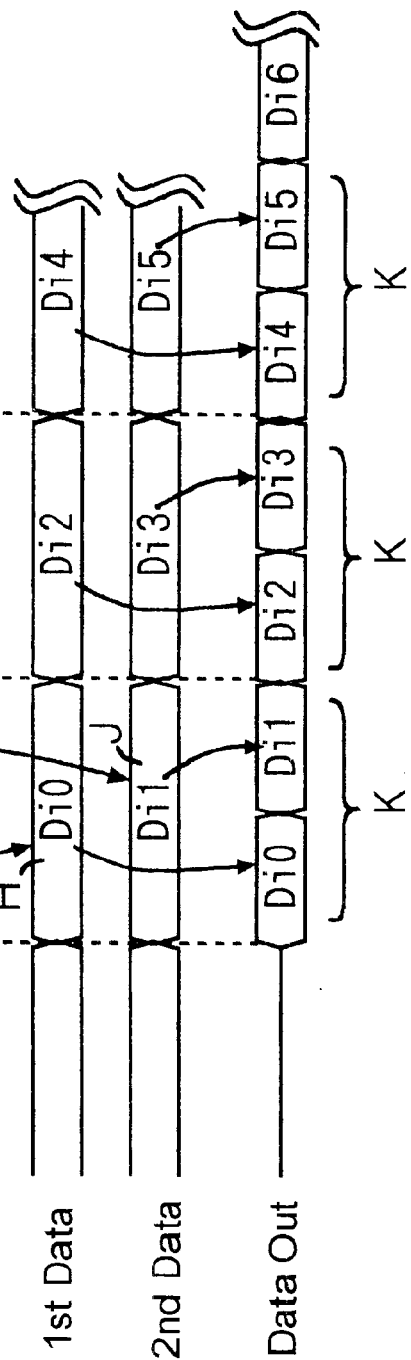
FIGS. 2A–2F are timing diagrams showing an operation in the data generator of FIG. 1.
Figure 3:
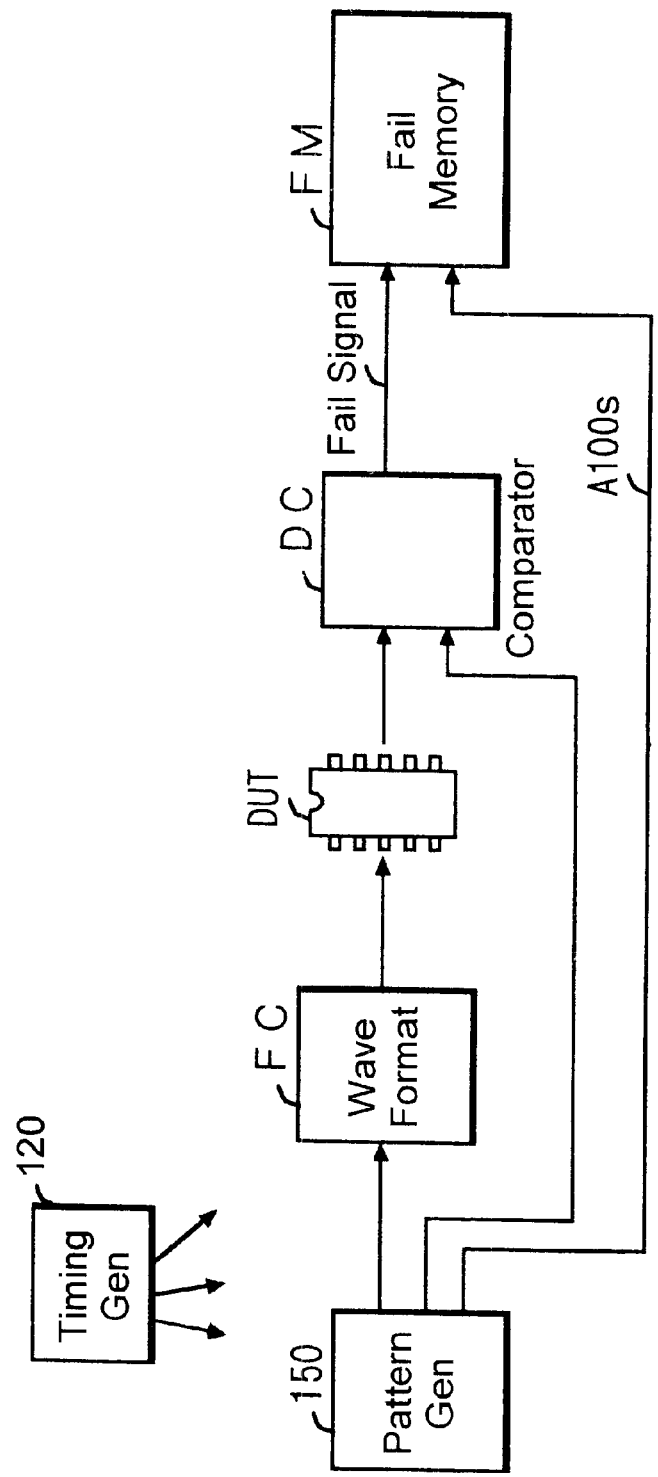
FIG. 3 is a schematic diagram showing a basic configuration of a semiconductor test system.
Figure 4:
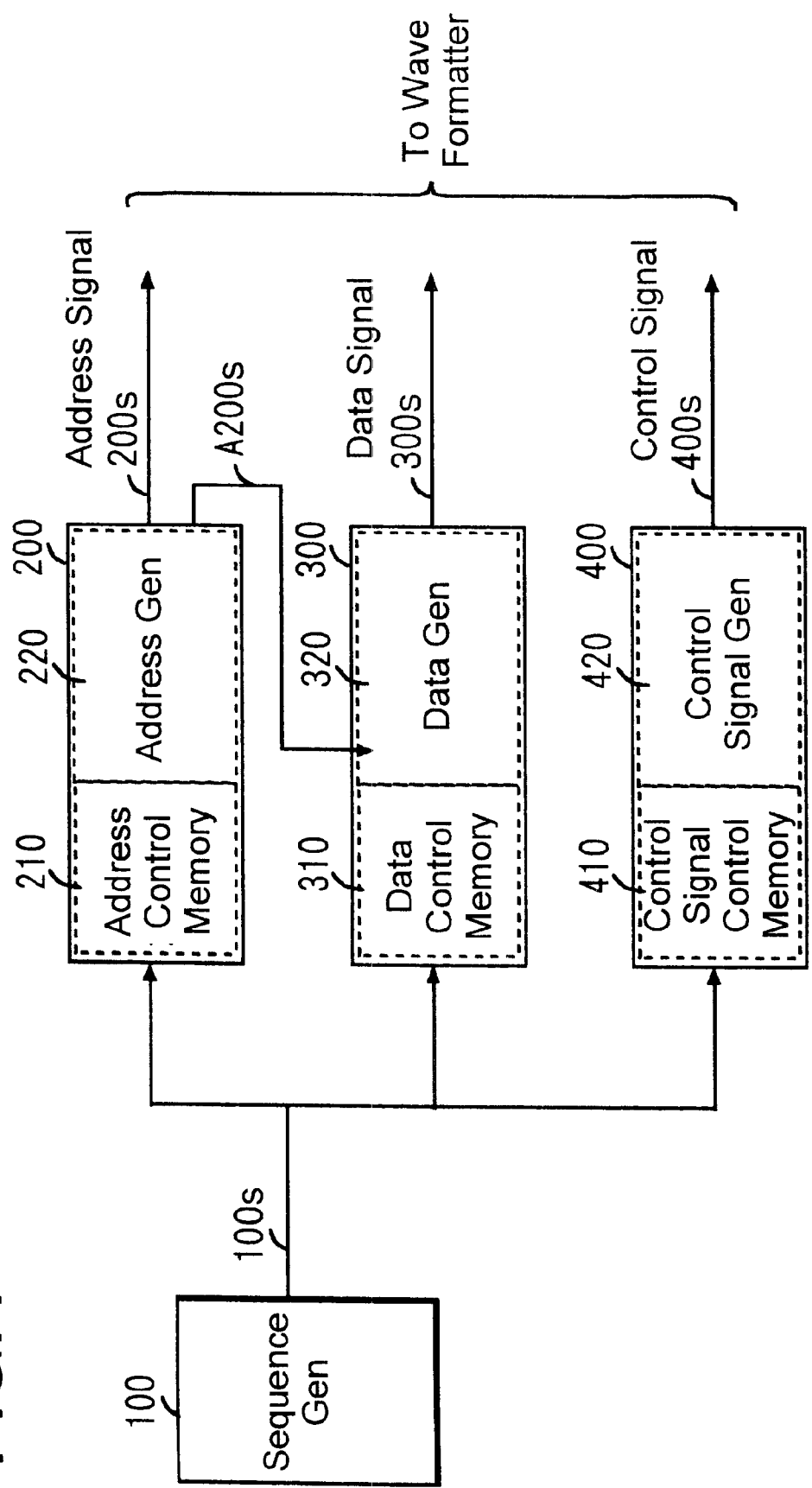
FIG. 4 is a schematic diagram showing a basic configuration of the pattern generator used in the semiconductor test system of FIG. 3.

The address converter 350 receives the address signal A200s of FIG. 2A and produces an even number address having address data TA0, TA2, TA4, . . . as shown in FIG. 2B and an odd number address having address data TA1, TA3, TA5, . . . as shown in FIG. 2C. The sequence of each of the even and odd number addresses is the test rate T. Thus, by multiplexing the even and odd number addresses, an address signal of T/2 repetition rate can be created.

The first pattern signal having the odd number write data Di0, Di2, Di4, . . . as shown in FIG. 2D which is inverted as a function of the even number address of FIG. 2B is produced at the output of the pattern generator. Similarly, the second pattern signal having the even number write data Di1, Di3, Di5, . . . as shown in FIG. 2F which is inverted as a function of the odd number address of FIG. 2C is produced at the output of the pattern generator. Hence, the write data (test pattern) that matches the burst address generated within the DUT can be properly generated by the pattern generator of the present invention.

Figure 10:
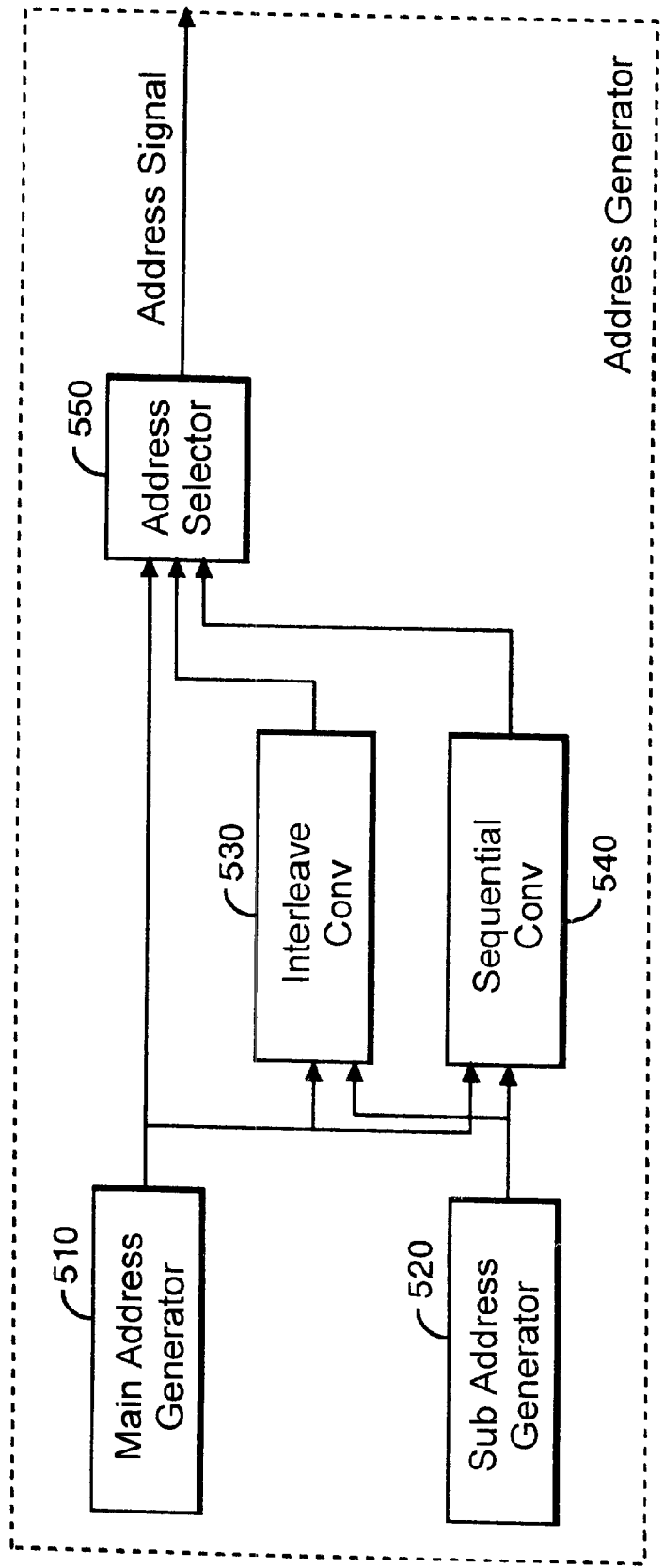
FIG. 10 is a schematic block diagram showing an example of address generator in the conventional technology for generating address signals including a burst address for testing a synchronous memory.
Figure 11:
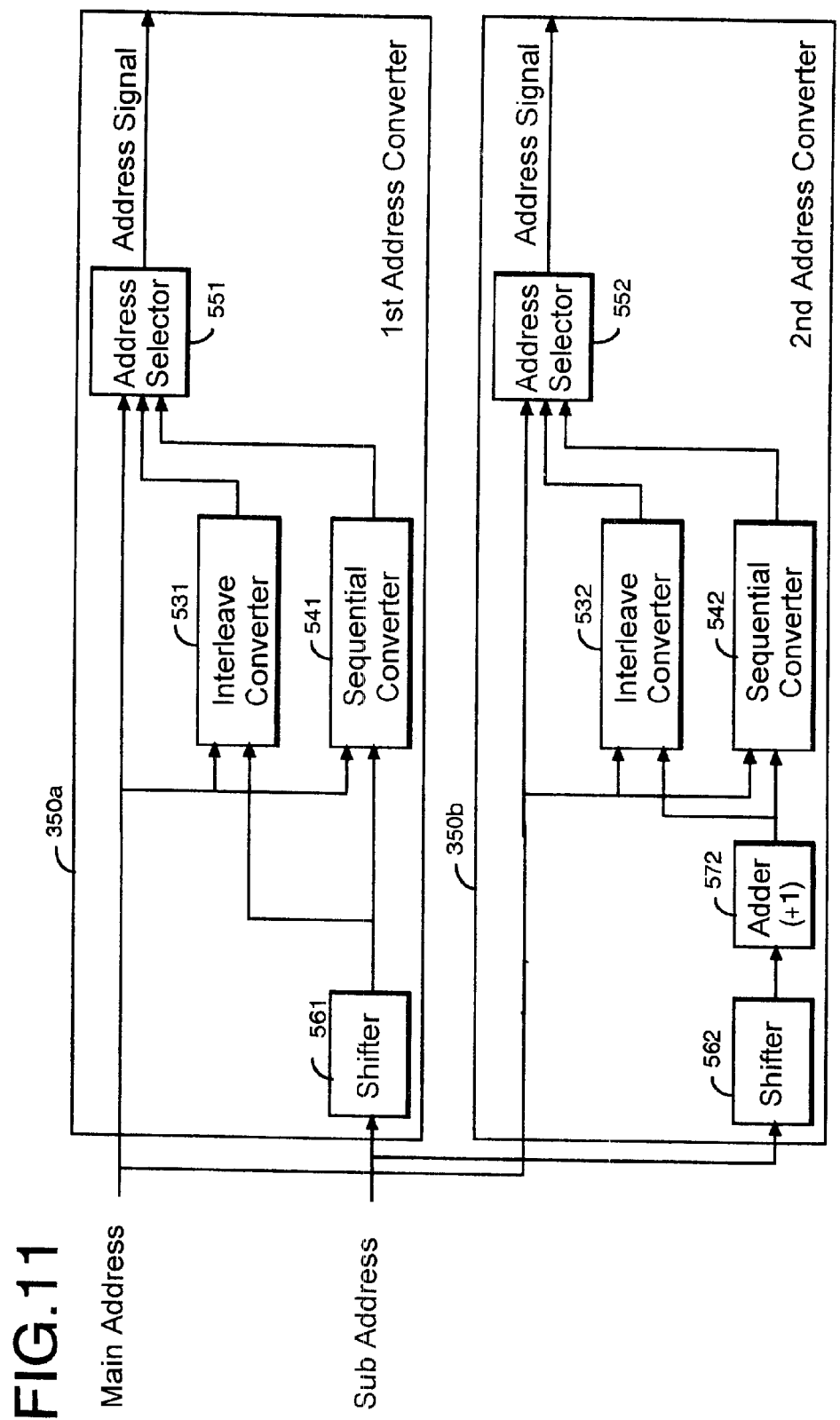
FIG. 11 is a schematic block diagram showing an example of address converter in the present invention to be used in the data generator for generating write data for testing a synchronous memory.

FIG. 11 shows an example of configuration in the address converter 350 in the pattern generator of the present invention. As noted above with reference to FIG. 1, the address converter 350 includes the first and second address converters 350a and 350b. In the example of FIG. 11, the first and second address converters are provided with the main address data and sub-address data from the main address generator and sub-address generator (FIG. 10). The first address converter 350a includes an address shifter 561, an interleave address converter 531, a sequential address converter 541 and an address selector 551. The second address converter 350b includes an address shifter 562, an adder 572, an interleave address converter 532, a sequential address converter 542 and an address selector 552.

Each of the address shifters 561 and 562 has a function of multiplying the incoming address values by two. Such a function can be easily achieved by, for example, a shift register with an additional LSB (lower significant bit). In the case where the sub-address data is incremented by two for every test rate T, such an address shifter is unnecessary.

The adder 572 in the second address converter 350b has a function to add one to the address output of the address shifter 562. Therefore, at the output of the address shifter 561, the even number address is produced while at the output of the adder 572, the odd number address is produced.

The interleave address converters 531 and 532, the sequential address converters 541 and 542, and the address selectors 551 and 552 function the same way as in the conventional example of FIG. 10. For generating the burst address for a predetermined bit length, the address data from either the interleave converter or the sequential converter is selected by the address selector. For generating the normal address data, the main address data is selected by the address selector. As shown in FIG. 1, the outputs of the first and second address converter 350a are respectively provided to the first and second address function generators 322a and 322b as well as to the first and second data topology controllers 323a and 323b.

FIG. 12 shows an example of pattern program to be executed in the pattern generator of the present invention for achieving the foregoing operation in the pattern generator of the present invention. FIG. 13 shows an example of address conversion in the first address converter 350a and the second address converter 350b. In this example, it is assumed that the start address in the burst address mode of the synchronous memory under test is "3" and the burst length is 8 bits.

In FIG. 12, the pattern program shows "Sequencer address", "Sequencer Instruction", "Address Instruction", and "Data Instruction"f. In Sequencer Instruction, "INC" is an instruction to increment the sequencer by one, and "LOOP" is an instruction to branch the sequencer by the number of times set in "Label". In Address Instruction, "MA<3" is an instruction to initialize the address generated by the main address generator to "3" for setting the start address in the burst address mode. "MA<MA" is an instruction to hold the main address. "MA<MA+8" is an instruction to add "8" to the main address for adding the burst address length. "SA<0" is an instruction to initialize the sub-address generated by the sub-address generator to "0", and "SA<SA+1" is an instruction to increment the sub-address generated by the sub-address generator by one. In DATA Instruction, "DT1<5555" is an instruction to initialize the data generated by the data generator to "5555". "DT1<DT1" is an instruction to hold the data, and "FP1" is an instruction to set the address function to produce a checkerboard pattern.

Tables of FIGS. 13A and 13B show (1) main address generator output, (2) sub-address generator output, (3) address shifter output, (4) adder output, (5) interleave converter output, (6) sequential converter output, (7) address output in which (7)-1 is an interleave address and (7)-2 is a sequential address. By multiplexing the conversion results of the first address conversion and second address conversion, a desired address sequence with high speed can be produced.

In addressing an RDRAM (Rambus DRAM), the lower 3 bits of the address are not used. However, as far as generating the address function is concerned, it is similar to the sequential address noted above except the start address is set to "000". In the burst mode of RDRAM, the burst length is 8 bits. Thus, the configuration of the present invention can operate properly to test the RDRAMs.

Figure 9:
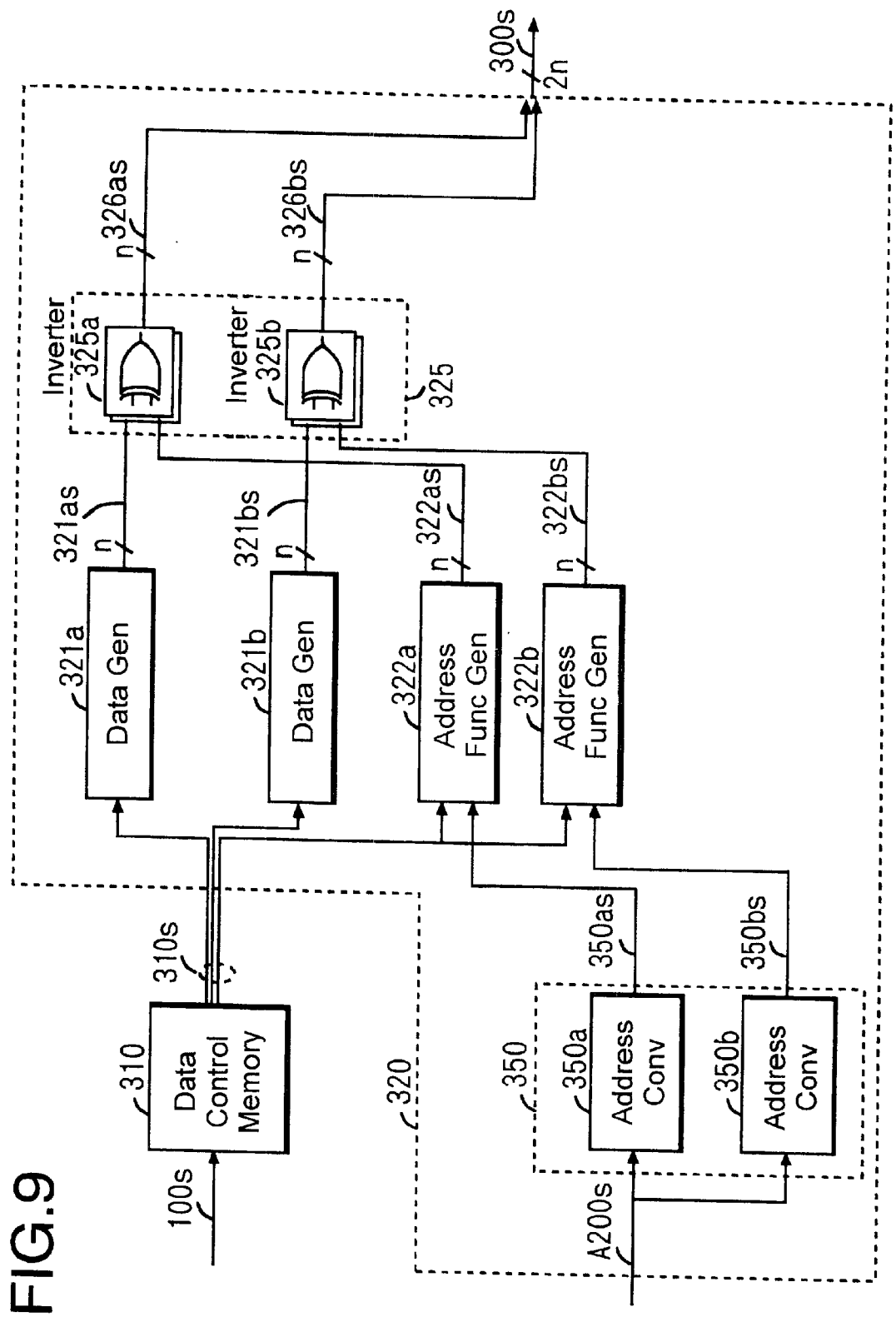
FIG. 9 is a schematic block diagram showing another example of structure of a data generator employed in the pattern generator of the present invention.

The present invention described above is not limited to the embodiments described above. For example, for a semiconductor test system that lacks the data topology controller 323 and the topology inverter 326 of FIG. 5, a configuration of the present invention shown in FIG. 9 can be used. When increasing the number of lines, from one to n, for inversion information signal at the output of the first and second address function generators 322a and 322b, such an inversion address signal may also be able to control the topology inversion when the inversion requirement is relatively simple.

In the present invention described above, semiconductor devices under test are memory devices, especially, a synchronous memory. However, the present invention can also be advantageously applicable to test a system LSI, such as a system-on-a-chip (SoC) having a high speed memory therein.

According to the present invention, the semiconductor test system having a pattern generator is capable of producing a multiplexed test pattern that has a repetition rate higher than the basic repetition rate of each test pattern. The data in the test pattern to be provided to a semiconductor device under test can be accurately modified by inverting the specified data therein as a function of address data, thereby effectively testing the semiconductor device at high speed. The pattern generator of the present invention is especially effective for testing a synchronous memory such as a synchronous dynamic random access memory (SDRAM) and a synchronous static random access memory (SSRAM) and a Rumbus dynamic random access memory (RDRAM).

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A pattern generator for generating a test pattern to test a memory device, comprising:

an address generator for generating an address signal with a test rate T to be supplied to a memory device under test;

a data generator for generating write data to be stored in the memory device under test, said data generator comprising:

a first data generator for generating even number write data;

a second data generator for generating odd number write data;

an address converter provided with said address signal from said address generator for generating an even number address incrementing by two at each test rate T and an odd number address incrementing by two at each test rate T;

first means for inverting said even number data from said first data generator as a function of said even number address from said address converter; and second means for inverting said odd number data from said second data generator as a function of said odd number address from said address converter.

2. A pattern generator as defined in claim 1, further comprising a sequence generator for generating sequence data at the test rate T to drive said address generator and said data generator.

3. A pattern generator as defined in claim 1, wherein said data generator further comprising a data operation control memory provided with said sequence data for producing control data which is supplied to the first data generator and the second data generator.

4. A pattern generator as defined in claim 1, wherein said address converter comprising a first address converter having means for generating a first burst address as said even address signal and a second address converter having means for generating a second burst address as said odd address signal.

5. A pattern generator as defined in claim 1, wherein said first means for inverting said even number data comprising:

a first address function generator for generating a first inversion signal as a function of said even number address from said address converter; and a first inverter provided with said even number data from said first data generator and said first inversion signal from said first address function generator, thereby inverting said even number data corresponding to said first inversion signal;

and wherein said second means for inverting said odd number data comprising:

a second address function generator for generating a second inversion signal as a function of said odd number address from said address converter; and a second inverter provided with said odd number data from said second data generator and said second inversion signal from said second address function generator, thereby inverting said odd number data corresponding to said second inversion signal.

6. A pattern generator as defined in claim 1, wherein said first means for inverting said even number data comprising:

a first address function generator for generating a first inversion signal as a function of said even number address from said address converter;

a first inverter provided with said even number data from said first data generator and said first inversion signal from said first address function generator, thereby inverting said even number data corresponding to said first inversion signal;

a first data topology controller for generating a first topology inversion signal as a function of said even number address from said address converter where said topology is a charge/discharge condition in said memory device under test; and a first topology inverter provided with said even number data from said first inverter and said first topology inversion signal from said first data topology controller, thereby inverting said even number data corresponding to said first topology inversion signal; and wherein said second means for inverting said odd number data comprising:

a second address function generator for generating a second inversion signal as a function of said odd number address from said address converter;

a second inverter provided with said odd number data from said second data generator and said second inversion signal from said second address function generator, thereby inverting said odd number data corresponding to said second inversion signal;

a second data topology controller for generating a second topology inversion signal as a function of said odd number address from said address converter; and a second topology inverter provided with said odd number data from said second inverter and said second topology inversion signal from said second data topology controller, thereby inverting said odd number data corresponding to said second topology inversion signal.

7. A pattern generator as defined in claim 1, wherein said address converter comprising:

a first address converter having means for generating a first burst address as said even number address; said first address converter comprising:

a first address shifter for incrementing a received address by two at every test rate T;

a first burst address converter for converting a received address to said first burst address in a form determined by said memory device under test; and a first address selector for selectively producing said first burst address as said even number address; and a second address converter having means for generating a second burst address as said odd number address; said second address converter comprising:

a second address shifter for incrementing a received address by two at every test rate T;

a second burst address converter for converting a received address to said second burst address in a form determined by said memory device under test; and a second address selector for selectively producing said second burst address as said odd number address.

8. A pattern generator as defined in claim 1, wherein said memory device under test is a synchronous memory including a synchronous dynamic random access memory (SDRAM) and a synchronous static random access memory (SSRAM) and a Rumbus dynamic random access memory (RDRAM).

9. A pattern generator for generating a test pattern to test a memory device, comprising:

a sequence generator for generating sequence data at a test rate T to drive a pattern generator for generating a test pattern based on a test program;

an address generator receiving said sequence data for generating an address signal with said test rate T to be supplied to a memory device under test;

a data generator receiving said sequence data for generating write data to be stored in the memory device under test, said data generator comprising:

a first data generator for generating even number write data;

a second data generator for generating odd number write data;

a first address converter provided with said address signal from said address generator for generating an even number address incrementing by two at each test rate T either in an interleave mode or a sequential mode determined by said memory device under test;

a second address converter provided with said address signal from said address generator for generating an odd number address incrementing by two at each test rate T either in the interleave mode or the sequential mode determined by said memory device under test;

first means for inverting said even number data from said first data generator as a function of said even number address from said address converter; and second means for inverting said odd number data from said second data generator as a function of said odd number address from said address converter.

10. A pattern generator as defined in claim 9, wherein said first means for inverting said even number data comprising:

a first address function generator for generating a first inversion signal as a function of said even number address from said address converter;

a first inverter provided with said even number data from said first data generator and said first inversion signal from said first address function generator, thereby inverting said even number data corresponding to said first inversion signal;

a first data topology controller for generating a first topology inversion signal as a function of said even number address from said address converter where said topology is a charge/discharge condition in said memory device under test; and a first topology inverter provided with said even number data from said first inverter and said first topology inversion signal from said first data topology controller, thereby inverting said even number data corresponding to said first topology inversion signal;

and wherein said second means for inverting said odd number data comprising:

a second address function generator for generating a second inversion signal as a function of said odd number address from said address converter;

a second inverter provided with said odd number data from said second data generator and said second inversion signal from said second address function generator, thereby inverting said odd number data corresponding to said second inversion signal;

a second data topology controller for generating a second topology inversion signal as a function of said odd number address from said address converter; and a second topology inverter provided with said odd number data from said second inverter and said second topology inversion signal from said second data topology controller, thereby inverting said odd number data corresponding to said second topology inversion signal.

11. A pattern generator as defined in claim 9, wherein said first address converter having means for generating a first burst address as said even number address, said first address converter comprising:

a first address shifter for incrementing a received address by two at every test rate T;

a first burst address converter for converting a received address to said first burst address in a form determined by said memory device under test; and a first address selector for selectively producing said first burst address as said even number address;

and said second address converter having means for generating a second burst address as said odd number address; said second address converter comprising:

a second address shifter for incrementing a received address by two at every test rate T;

a second burst address converter for converting a received address to said second burst address in a form determined by said memory device under test; and a second address selector for selectively producing said second burst address as said odd number address.

12. A semiconductor test system for testing a semiconductor memory device by providing a test pattern to a memory device under test and evaluating output data of the memory device, comprising:

a sequence generator for generating sequence data at a test rate T to drive a pattern generator for generating a test pattern based on a test program;

an address generator receiving said sequence data for generating an address signal with said test rate T to be supplied to a memory device under test:

a data generator receiving said sequence data for generating write data to be stored in the memory device under test, said data generator comprising:

a first data generator for generating even number write data;

a second data generator for generating odd number write data;

a first address converter provided with said address signal from said address generator for generating an even number address incrementing by two at each test rate T either in an interleave mode or a sequential mode determined by said memory device under test;

a second address converter provided with said address signal from said address generator for generating an odd number address incrementing by two at each test rate T either in the interleave mode or the sequential mode determined by said memory device under test;

first means for inverting said even number data from said first data generator as a function of said even number address from said address converter; and second means for inverting said odd number data from said second data generator as a function of said odd number address from said address converter; and a wave formatter for receiving said even number data from said first means and said odd number data from said second means in a parallel form and combining said data in a serial form to be supplied to said memory device under test;

a logic comparator for comparing output data of said memory device under test with :expected data and producing a failure signal when a mismatch arises between the output data and expected data; and a failure memory for storing the failure signal from said logic comparator in an address corresponding to an address of said memory device under test causing said failure signal.

13. A semiconductor test system as defined in claim 12, wherein said first means for inverting said even number data comprising:

a first address function generator for generating a first inversion signal as a function of said even number address from said address converter;

a first inverter provided with said even number data from said first data generator and said first inversion signal from said first address function generator, thereby inverting said even number data corresponding to said first inversion signal;

a first data topology controller for generating a first topology inversion signal as a function of said even number address from said address converter where said topology is a charge/discharge condition in said memory device under test; and a first topology inverter provided with said even number data from said first inverter and said first topology inversion signal from said first data topology controller, thereby inverting said even number data corresponding to said first topology inversion signal;

and wherein said second means for inverting said odd number data comprising:

a second address function generator for generating a second inversion signal as a function of said odd number address from said address converter;

a second inverter provided with said odd number data from said second data generator and said second inversion signal from said second address function generator, thereby inverting said odd number data corresponding to said second inversion signal;

a second data topology controller for generating a second topology inversion signal as a function of said odd number address from said address converter; and a second topology inverter provided with said odd number data from said second inverter and said second topology inversion signal from said second data topology controller, thereby inverting said odd number data corresponding to said second topology inversion signal.

14. A semiconductor test system as defined in claim 12, wherein said first address converter having means for generating a first burst address as said even number address, said first address converter comprising:

a first address shifter for incrementing a received address by two at every test rate T;

a first burst address converter for converting a received address to said first burst address in a form determined by said memory device under test; and a first address selector for selectively producing said first burst address as said even number address;

and said second address converter having means for generating a second burst address as said odd number address; said second address converter comprising:

a second address shifter for incrementing a received address by two at every test rate T;

a second burst address converter for converting a received address to said second burst address in a form determined by said memory device under test; and a second address selector for selectively producing said second burst address as said odd number address.

15. A semiconductor test system as defined in claim 12, wherein said memory device under test is a synchronous memory including a synchronous dynamic random access memory (SDRAM) and a synchronous static random access memory (SSRAM) and a Rumbus dynamic random access memory (RDRAM).

* * * * *